US00RE40225E

(19) United States
(12) Reissued Patent
Finarov

(10) Patent Number: US RE40,225 E
(45) **Date of Reissued Patent: *Apr. 8, 2008**

(54) TWO-DIMENSIONAL BEAM DEFLECTOR

(75) Inventor: Moshe Finarov, Rehovot (IL)

(73) Assignee: Nova Measuring Instruments Ltd., Rehovot (IL)

( * ) Notice: This patent is subject to a terminal disclaimer.

(21) Appl. No.: 10/284,308

(22) Filed: Oct. 31, 2002

Related U.S. Patent Documents

Reissue of:
(64) Patent No.: 5,764,365
Issued: Jun. 9, 1998
Appl. No.: 08/645,346
Filed: May 13, 1996

U.S. Applications:
(63) Continuation of application No. 09/557,938, filed on Apr. 24, 2000, now Pat. No. Re. 38,153, which is a continuation-in-part of application No. 08/221,724, filed on Apr. 1, 1994, now Pat. No. 5,517,312.

(30) Foreign Application Priority Data

Nov. 9, 1993 (IL) ..... 107549

(51) Int. Cl.
*G01B 11/06* (2006.01)
*G02B 26/08* (2006.01)

(52) U.S. Cl. ..... 356/630; 356/369
(58) Field of Classification Search ..... 356/364–369, 356/630–632, 237.1–237.5; 438/16, 908; 250/225; 359/202
See application file for complete search history.

(56) References Cited

U.S. PATENT DOCUMENTS

| | | | | |
|---|---|---|---|---|
| 3,645,623 A | | 2/1972 | Patten | |
| 3,869,211 A | | 3/1975 | Watanabe et al. | |
| 4,308,586 A | | 12/1981 | Coates | 356/357 |
| 4,516,855 A | | 5/1985 | Korth | |
| 4,555,767 A | | 11/1985 | Case et al. | 356/381 |
| 4,585,348 A | | 4/1986 | Chastang et al. | |
| 4,618,262 A | | 10/1986 | Maydan et al. | 356/357 |
| 4,647,207 A | | 3/1987 | Bjork et al. | |
| 4,653,924 A | | 3/1987 | Itonaga et al. | |
| 4,681,450 A | | 7/1987 | Azzam | |
| 4,713,140 A | | 12/1987 | Tien | 356/381 |
| 4,815,856 A | | 3/1989 | Bruce | 356/357 |
| 4,826,321 A | | 5/1989 | Coates et al. | |
| 4,842,410 A | | 6/1989 | Darrah et al. | |
| 4,873,430 A | | 10/1989 | Juliana et al. | 356/382 |
| 4,908,508 A | | 3/1990 | Dubbeldam | 356/381 |
| 4,957,368 A | | 9/1990 | Smith | |
| 4,962,063 A | | 10/1990 | Maydan et al. | |
| 4,974,919 A | | 12/1990 | Muraki et al. | 359/204 |
| 4,999,014 A | | 3/1991 | Gold et al. | |
| 5,042,951 A | | 8/1991 | Gold et al. | |
| 5,061,072 A | | 10/1991 | Folkard et al. | |
| 5,120,966 A | | 6/1992 | Kondo | |
| 5,159,412 A | | 10/1992 | Willenborg et al. | |
| 5,166,752 A | | 11/1992 | Spanier et al. | |
| 5,181,080 A | | 1/1993 | Fanton et al. | |
| 5,259,881 A | * | 11/1993 | Edwards et al. | 118/719 |
| 5,274,434 A | | 12/1993 | Morioka et al. | |
| 5,310,410 A | * | 5/1994 | Begin et al. | 29/25.01 |
| 5,420,680 A | | 5/1995 | Isobe et al. | |
| 5,695,564 A | | 12/1997 | Imahashi | |
| 5,766,360 A | | 6/1998 | Sato et al. | |
| 5,940,175 A | * | 8/1999 | Sun | 356/237.3 |
| 6,113,733 A | | 9/2000 | Eriguchi et al. | |

FOREIGN PATENT DOCUMENTS

EP 0558781 A1 9/1993

(Continued)

*Primary Examiner*—Hoa Q. Pham
(74) *Attorney, Agent, or Firm*—Browdy and Neimark, PLLC

(57) ABSTRACT

A two dimensional beam deflector is disclosed which deflects beams from multiple optical assemblies. The input of beams of the multiple optical assemblies follow parallel optical paths until deflection to a wafer. An ellipsometer using a two-dimensional beam deflector is also disclosed.

39 Claims, 7 Drawing Sheets

FOREIGN PATENT DOCUMENTS

| | | |
|---|---|---|
| EP | 0 558 781 B1 | 8/1998 |
| JP | 59-109807 | 6/1984 |
| JP | 59-125009 | 7/1984 |
| JP | 01-012208 | 1/1989 |
| JP | 01-105556 | 4/1989 |
| JP | A01054207 | 6/1989 |
| JP | 02-126106 | 5/1990 |
| JP | 04-301506 | 10/1992 |
| JP | 05-002060 | 1/1993 |
| JP | 05-090211 | 4/1993 |
| JP | 05-280937 | 10/1993 |
| WO | WO 87/06561 | 11/1987 |
| WO | WO 92/00485 | 1/1992 |
| WO | WO 93/03254 | 2/1993 |

* cited by examiner

FIG.2
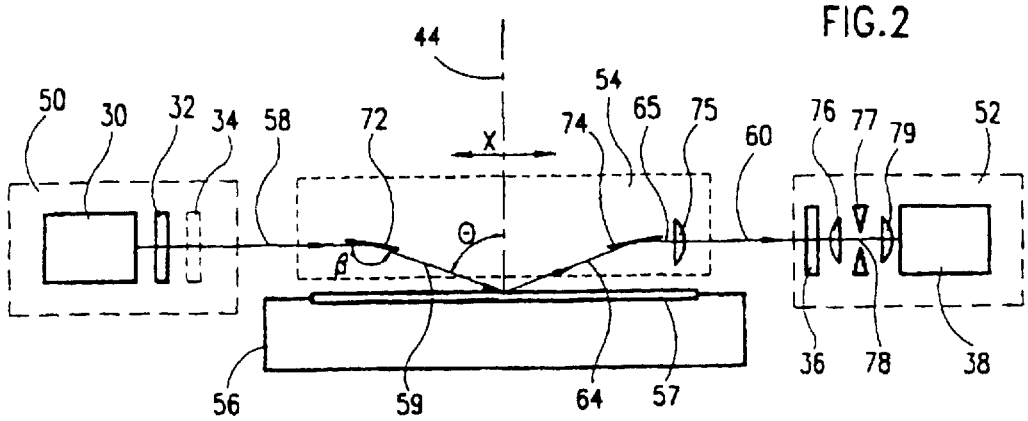
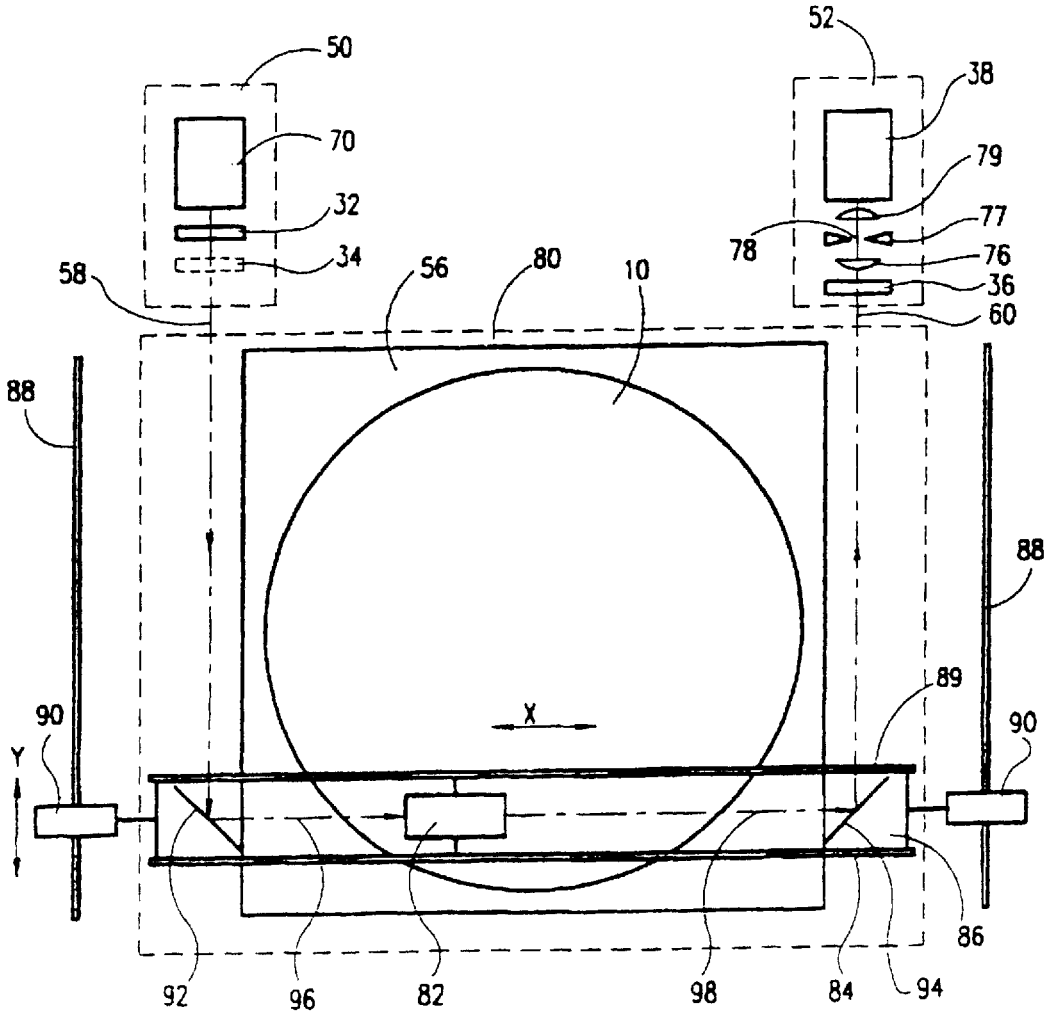
FIG.3

TWO-DIMENSIONAL BEAM DEFLECTOR

Matter enclosed in heavy brackets [ ] appears in the original patent but forms no part of this reissue specification; matter printed in italics indicates the additions made by reissue.

This application is a continuation of U.S. patent application No. 09/557,938, filed Apr. 24, 2000, *now reissued U.S. Pat. No. RE 38153, which is a reissue of U.S. patent application No. 08/645,346, filed May 13, 1996, now U.S. Pat. No. 5,764,365, which is a* continuation-in-part of U.S. patent application Ser. No. 08/221,724, filed on Apr. 1, 1994, now U.S. Pat. No. 5,517,312.

FIELD OF THE INVENTION

The present invention relates to systems and methods for non-destructive quality control in general and to optical systems and methods for measuring the thickness and index of refraction of thin films, in particular.

BACKGROUND OF THE INVENTION

Optical measuring instruments are typically utilized in the microelectric industry for non-contact, non destructive measurement of the thickness of thin films. Two main systems are utilized, spectrophotometers (or reflectometers) and ellipsometers. The following U.S. patents represent the prior art:

For ellipsometers: U.S. Pat. Nos. 5,166,752, 5,061,072, 5,042,951, 4,957,368, 4,681,450, 4,653,924, 4,647,207 and 4,516,855.

For spectrophotometers: U.S. Pat. Nos. 5,181,080, 5,159, 412, 5,120,966, 4,999,014 and 4,585,348.

The two prior art systems are illustrated in FIGS. 1A and 1B, respectively, to which reference is now made. The spectrophotometer utilizes the fact that light beams reflected off thin film boundaries, will interfere one with another. Specifically, the spectrophotometer of FIG. 1A measures the reflectance of selected points of a sample 10 as a function of the light wavelength, usually in the visible or near UV spectral ranges. Computer analysis of the detected spectral reflection function, especially its minima and maxima, provides the thickness, and in some cases, also the index of refraction of the measured film.

The spectrophotometer typically includes a transmitter 12 with a light source and appropriate optics, a beam splitter 14, as objective lens 16, a tube lens 18 and a receiver 20 which includes optical and electronic means for measurement of light intensity as a function of the input light wavelength. The transmitter 12 produces a collimated light beam 22 which is deflected by the beam splitter 14 and focused on the sample 10 by the objective lens 16. The reflected beam, labeled 24, is collected by the microscope imaging optics (lenses 16 and 18) on to a spectroscopic measurement unit within the receiver 20.

In order to measure a multiplicity of points on the sample 10, sample 10 is placed on an x-ray stage 26, X-Y stage 26 is typically very precise and heavy and, as a result, moves very slowly.

The spectrophotometers have difficulty measuring structures with very small reflectance, such as thin films on glass substrates, because the relatively low brightness of traditional white light sources does not provide a sufficient signal-to-noise ration (SNR). Spectrophotometers also have difficulty measuring films with unknown or unrepeatable dispersions of optical constants, such as amorphous silicon.

Despite these limitations, the spectral photometry method is at present widely used in industry because the instrumentation for this method is easily combined with optical microscopes and can utilize conventional microscope optics.

Ellipsometers measure changes in the polarization of light caused by reflectance from the test surface. These changes, characterized as amplitude and phase changes, are very sensitive to the thickness and optical properties of thin films.

A prior art ellipsometer is illustrated in FIG. 1B. It includes a transmitter 30 which includes a light source and appropriate optics, a polarizer 32, an optional compensator (phase retarder) 34, an analyzer 36 and a receiver 38 with a photo-detector and appropriate electronics. The polarizer 32 polarizes the light beam 40 produced by light source 30. The reflected light beam, labeled 42, passes through the analyzer 36 before reaching the receiver 38. If the compensator 34 is used, it may be loaded either between the polarizer 32 and the test sample 10 or between the sample 10 and the analyzer 36.

The ellipsometric method requires oblique illumination, i.e. an angle of incidence Θ between an incident light beam 40 and a normal 44 to the sample 10 must be greater than zero. The angle between a reflected light beam 42 and the normal 44 is equal to the angle of incidence Θ. The angle of incidence Θ should be close to the Brewster angle $\Theta_B$ of the substrate. In practice, the angle of incidence Θ ranges from 45° to 70°.

Because ellipsometers measure two polarization parameters (amplitude and phase), both of which are independent of the light intensity, they are quite accurate and can also measure ultra thin films of the size of 0–100Å. However, since ellipsometers require oblique illumination as well as a highly collimated light beam, their use for high spatial resolution measurements in dense patterned structures is rather difficult.

There are two basic types of fully automated ellipsometers. Null-ellipsometers (NE) provide the most accurate thickness measurements but they require at least several seconds per measuring point. Rotating-analyzer ellipsometers (RAE) provide very high speed measurements (portions of a second per measuring point), but their sensitivity and accuracy are usually less than those of null ellipsometers.

For all of the prior art instruments, the opto-mechanical apparatus is complicated, large and heavy, and thus, the x-y stage 26 is translated between measurement points, coming to a complete stop before measurement begins. The time between measurements depends on the mass of the x-y stage 26 and on the positioning accuracy requirements and may take at least several seconds (sometimes up to several tens of seconds). This limits the speed with which a thickness mapping can occur, especially during inspection of large size substrates such as 8" VLSI silicon wafers, 18"×18" LCD glass panels, etc.

The footprint, or space on the floor which each machine utilizes, is typically at least twice the size of the x-y stage 26 due to its translation.

Furthermore, the prior art measuring devices are utilized for measuring once a deposition process has been completed. They cannot be utilized for in-process control, since wafer handling and other mechanical movements are not allowed within a vacuum chamber.

Other measuring instruments are also known, one of which is described in U.S. Pat. No. 4,826,321. The '321 patent presents a system similar to an ellipsometer. However, in this system, a mirror is utilized to direct a plane polarized laser beam to the thin film surface at the exact Brewster angle of the substrate on which the this film lies.

SUMMARY OF THE PRESENT INVENTION

There is provided, in accordance with a preferred embodiment of the present invention, a two-dimensional beam deflector for a thickness measuring device for measuring the thickness of films on a sample with a plurality of different optical systems each performing a different measurement technique. The beam deflector includes a two dimensional translation unit, first and second deflection units and a plurality of optical assemblies. The two-dimensional translation unit translates the beam deflector along a first scanning axis and along a second scanning axis perpendicular to the first scanning axis. The first deflection unit receives a plurality of parallel input beams along parallel input axes which are close to one another and parallel to the first scanning axis. The first deflection unit also deflects the input beams along a plurality of parallel second axes close to each other and parallel to the second scanning axis. The second deflection unit receives a plurality of parallel output beams along parallel third axes close to each other and parallel to the second axes, and deflects the output beams along a plurality of parallel fourth axes close to each other and parallel to the first scanning axis. There is one optical assembly per input beam, each of which provides its input beam towards the sample, receives its output beam from the sample, processes its input and output beams in accordance with its measurement technique, and provides its output beams along the parallel third axes.

Additionally, in accordance with a preferred embodiment of the present invention, the optical assemblies can be at least an ellipsometric assembly and a spectrophotometric assembly.

There is also provided, in accordance with a preferred embodiment of the present invention, a thickness measuring device for measuring the thickness of thin films on a sample. The device includes first and second stationary illuminators, a beam deflector and first and second stationary receivers. The first and second stationary illuminators provide first and second collimated input light beams along first and second parallel input axes. The beam deflector directs the first and second input light beams towards the sample and direct and collimate corresponding first and second output light beams from the sample. The beam deflector includes a two-dimensional translation unit for translating the beam deflector along a first scanning axis parallel to the input axis, and along a second scanning axis perpendicular to the first scanning axis. The first and second stationary receivers respectively receive the first and second collimated output light beams along output axes parallel to the input axes.

There is further provided, in accordance with a preferred embodiment of the present invention, an ellipsometer which includes a stationary illuminator, a translatable beam deflector and a stationary receiver. The stationary illuminator provides a collimated input light beam along an input axis. The beam deflector, translatable at least along a first scanning axis parallel to the input axis, includes a) a first beam deflecting element for deflecting the input light beam at an angle of deflection towards the sample, b) a second beam deflecting element, different from the first beam deflecting element, for deflecting an output light beam reflected at an angle from the sample along the output axis and c) a collimating lens for receiving at least the output light beam from the second beam deflecting element and for collimating at least the output light beam. The stationary receiver receives the collimated output light beam along an output axis parallel to the input axis.

Additionally, in accordance with a preferred embodiment of the present invention, the beam deflector comprises one-dimensional translation unit for translation along the scanning axis. Alternatively, the beam deflector comprises two-dimensional translation unit for translating the beam deflector along the first scanning axis and along a second scanning axis perpendicular to the first scanning axis.

Moreover, in accordance with a preferred embodiment of the present invention, the beam deflector additionally comprises a first mirror for deflecting the input light beam from the input axis to the second scanning axis, a second mirror for deflecting the input light beam from the second scanning axis to the sample, a third mirror deflecting a reflected light beam from the sample to the second scanning axis, and a fourth mirror for deflecting the reflected light beam from the second scanning axis to the output axis.

Furthermore, in accordance with a preferred embodiment of the present invention, the first and second beam deflecting elements are mirrors.

Additionally, in accordance with a preferred embodiment of the present invention, the first beam deflecting element is a beam splitter and the second beam deflecting element is a mirror.

Finally, in accordance with a preferred embodiment of the present invention, the ellipsometer includes a unit for measuring an actual angle of incidence which may vary from the angle of deflection, wherein the unit for measuring utilizes optical elements forming part of the stationary illuminator and stationary receiver. The unit for measuring includes a position sensing device for measuring the angle of the output light beam with respect to a desired position.

BRIEF DESCRIPTION OF THE DRAWINGS

The present invention will be understood and appreciated more fully from the following detailed description taken in conjunction with the drawings in which:

FIG. 2 is a schematic side view illustration of an optical measuring device having a one-dimensional scanning device incorporated therein, constructed and operative in accordance with a preferred embodiment of the present invention;

FIG. 3 is a schematic top view illustration of an optical measuring device having a two-dimensional scanning device incorporated therein, constructed and operative in accordance with a second preferred embodiment of the present invention;

DETAILED DESCRIPTION OF PREFERRED EMBODIMENTS

Reference is now made to FIGS. 2 and 3 which schematically illustrate an optical measuring device having one and two-dimensional scanning devices, respectively, constructed and operative in accordance with preferred embodiments of the present invention. FIG. 2 is a side view and FIG. 3 is a top view.

Figure 6:
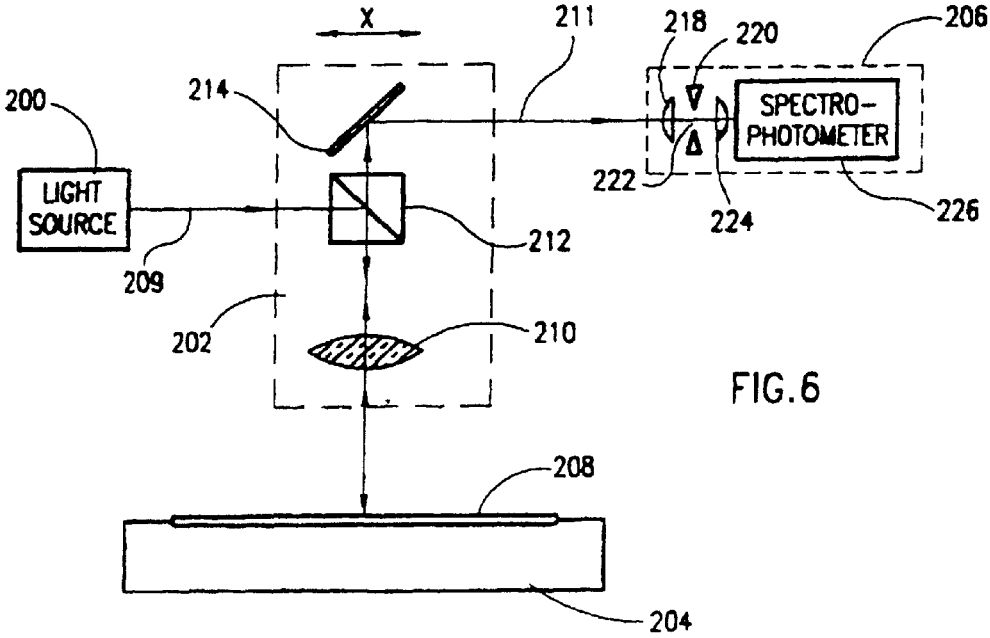
FIG. 6 is a schematic illustration of a spectrophotometer having a one-dimensional scanning device incorporated therein, constructed and operative in accordance with the principles of the present invention.

In FIGS. 2 and 3, the optical measuring device is an ellipsometer. This is by way of example only; the principles of the present invention can also be implemented in a spectrophotometer, as illustrated in FIG. 6, described in detail hereinbelow.

The ellipsometer of FIG. 2 typically comprises a stationary illuminator 50, a stationary detector 52, a translating beam deflector 54, and a stationary support 56, such as a stage, ring, etc., for holding a sample 57.

The illuminator 50 typically comprises of elements similar to those of the prior art. Therefore, similar elements have similar reference numerals.

Specifically, the illuminator 50 typically comprises transmitter 30 which includes a laser light source, a polarizer 32 and an optical compensator (phase retarder) 34. As in the prior art, the laser light source, with its associated optics (not shown), produces a highly collimated laser light beam.

The beam deflector 54 typically comprises two mirrors 72 and 74 and a first objective lens 75. Mirror 72 provides the desired angle of incidence $\Theta$ to input light beam 58 by deflecting beam 58 by an angle $\beta=90+\Theta$. Mirror 74 deflects a light beam 64, reflected from the sample 57, to a beam 65 along a direction parallel to the X scanning axis. First objective lens 75, whose focal plane is at the plane of sample 57, typically collimates beam 65, thereby producing a collimated reflected beam 60.

To effect scanning, only the beam deflector 54 is translated along the X-axis. The movement of the beam deflector 54 generally does not affect the measurement quality of the ellipsometer since the input and output light beams 58 and 60 are highly collimated and parallel to the scanning axis.

Because beam deflector 54 only comprises the mirrors 72 and 74 and objective lens 75, it is lightweight and therefore, its transition is fast, on the order of the measurement time. The support 56 is stationary, therefore, the device of the present invention has a minimal footprint of the size of the sample 57.

It is noted that the direction changing effected by mirrors 72 and 74 changes the polarization state of the light. These undesired changes must be separated from the desired polarization changes caused by the sample 57. If the optical parameters of the mirrors are stable, the undesired changes do not vary and thus, they can be measured and accounted for when interpreting the measurement of the sample 57.

It is further noted that reflection from the mirrors 72 and 74 may not be fully specular. Typically, some depolarized scattered light is also produced. While the percentage of scattered light is very small relative to the specular light (1:1000 or even less, depending on the quality of the mirror surface), the scattered light could limit the signal-to-noise ratio (SNR) of the system and thus, limit the measurement accuracy.

In accordance with a preferred embodiment of the present invention, the detector 52 typically comprises scattered light reducing elements in addition to the standard analyzer 36 and receiver 38. The scattered light reducing elements typically are a second objective lens 76 and a diaphragm 77, located at the focal plane of objective lens 76 and having a pinhole 78, and a condenser 79.

The analyzer 36 is typically placed within the collimated light beam 60, between objective lenses 75 and 76. Since pinhole 78 is placed at the center of the image plane which is the focal plane of lens 76, it acts as an aperture stop, allowing only the collimated portion of light beam 60 to pass through. Thus, the pinhole drastically reduces the widely scattered depolarized light introduced by the mirrors. Condenser 79 collects the light from the pinhole 78 and provides it to receiver 38.

For a pinhole 76 of 50 μm in diameter and a lens with a focal length of 30 mm, the angular aperture of the detector 52 is less than one mrad. For optical configurations having six or fewer mirrors between the polarizer 32 and the analyzer 36, the resultant intensity of scattered light reaching the detector 38 is less than $10^{-3}$% of the polarized light which is the minimum necessary for accurate ellipsometric measurements.

Receiver 38 typically comprises a photo-detector and appropriate electronics. Although not shown, the detector 52 can also include the compensator 34, located before the analyzer 36.

The ellipsometer of FIG. 3 provides two-dimensional scanning with a two-dimensional scanning unit 80. The remaining elements are similar to those of FIG. 2 and therefore, have similar reference numerals.

Scanning unit 80 typically comprises a beam deflector 82 (see FIG. 2) similar to beam deflector 54, which slides along X-axis rails 84. The X-axis rails 84 are attached together and to carriages 90, forming an X-axis unit 86 which, in turn, translates along Y-axis rails 88 via the carriages 90.

Scanning unit 80 typically also comprises mirrors 92 and 94 (see FIG. 3) which deflect beams between the X- and Y-axes. Specifically, mirror 92 deflects the input beam 58 from the Y axis to the X axis, producing beam 96 which is parallel to the X axis. Mirror 94 receives beam 98, the output of the beam deflector 82, along the X axis and deflects it towards the Y-axis, producing thereby reflected beam 60.

It is noted that the scattered light reducing elements 76–79 are efficient for a number of mirrors, as long as none of the mirrors are located very close to either the object or image planes.

Figure 1B:
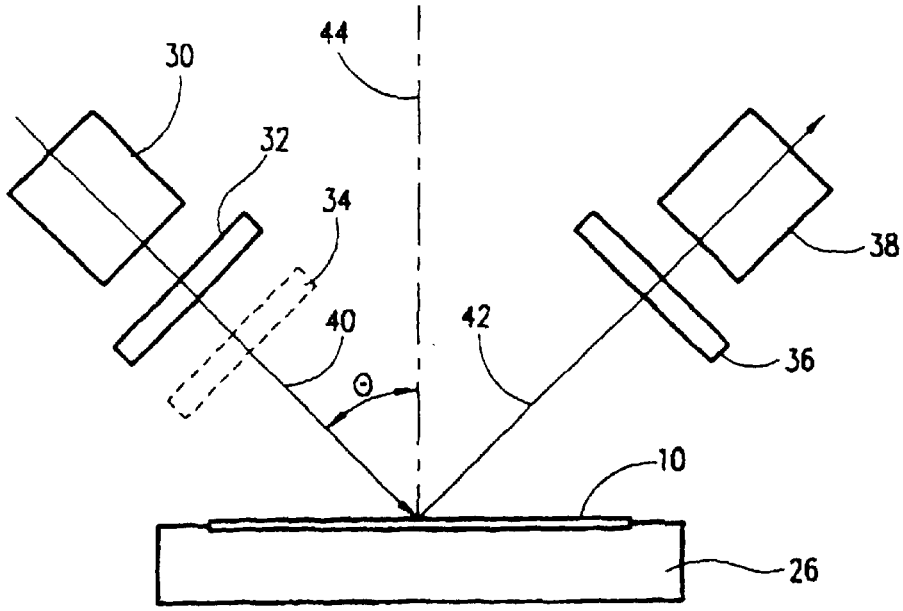
FIG.1B PRIOR ART
FIGS. 1A and 1B are schematic illustrations of a prior art spectrophotometer and a prior art ellipsometer.
Figure 1A:
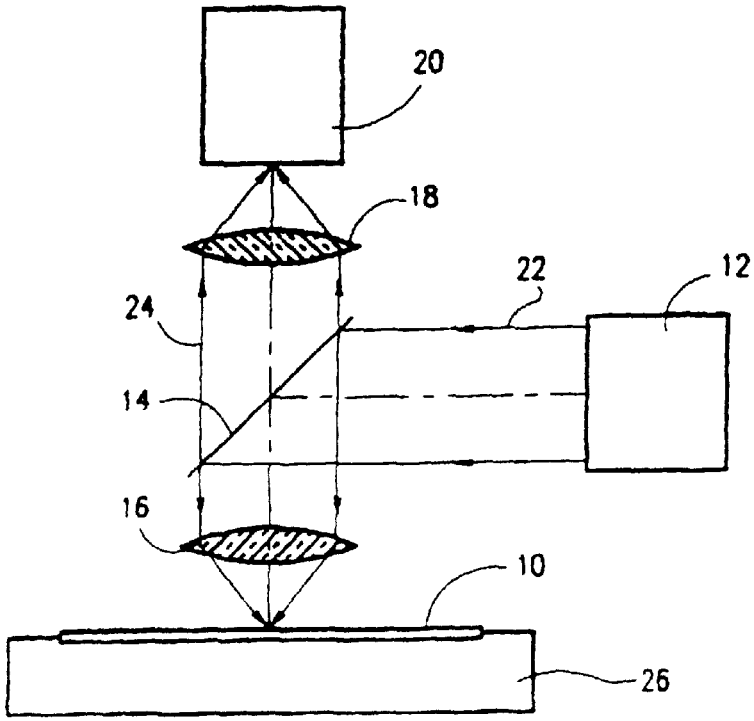
FIG.1A PRIOR ART
Figure 4:
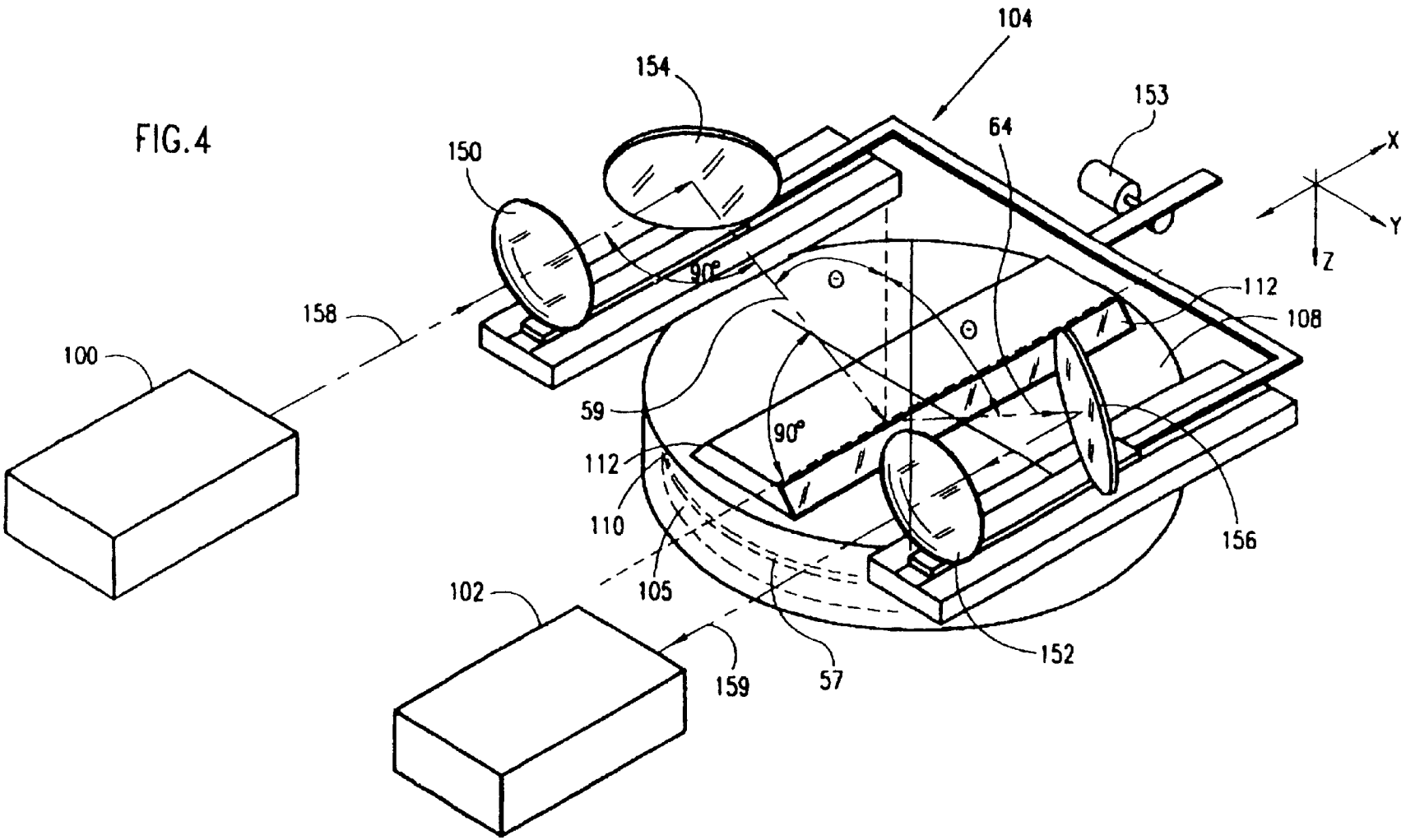
FIG. 4 is a partial schematic, partial block-diagram illustration of an ellipsometric in-process thickness monitor utilizing the principles illustrated in FIG. 2.
Figure 5A:
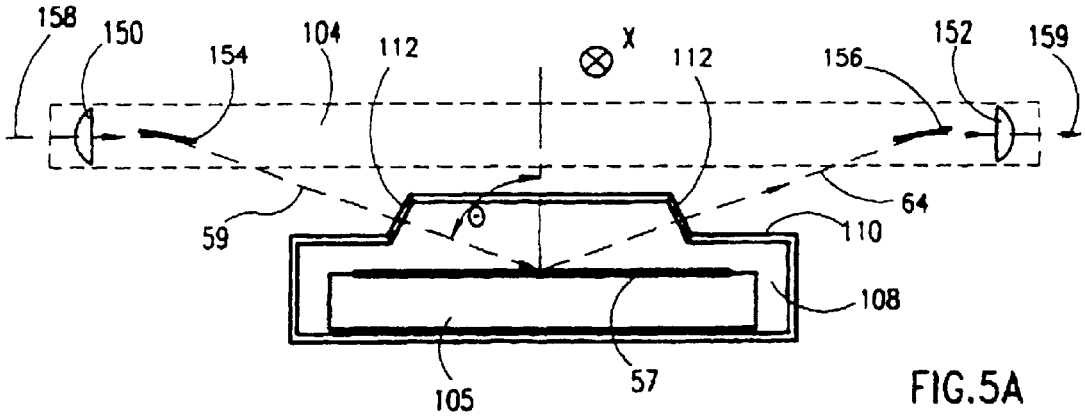
FIG. 5A is a side view schematic illustration of a beam deflector cooperating with a vacuum chamber, the beam deflector forming part of the monitor of FIG. 4.
Figure 5B:
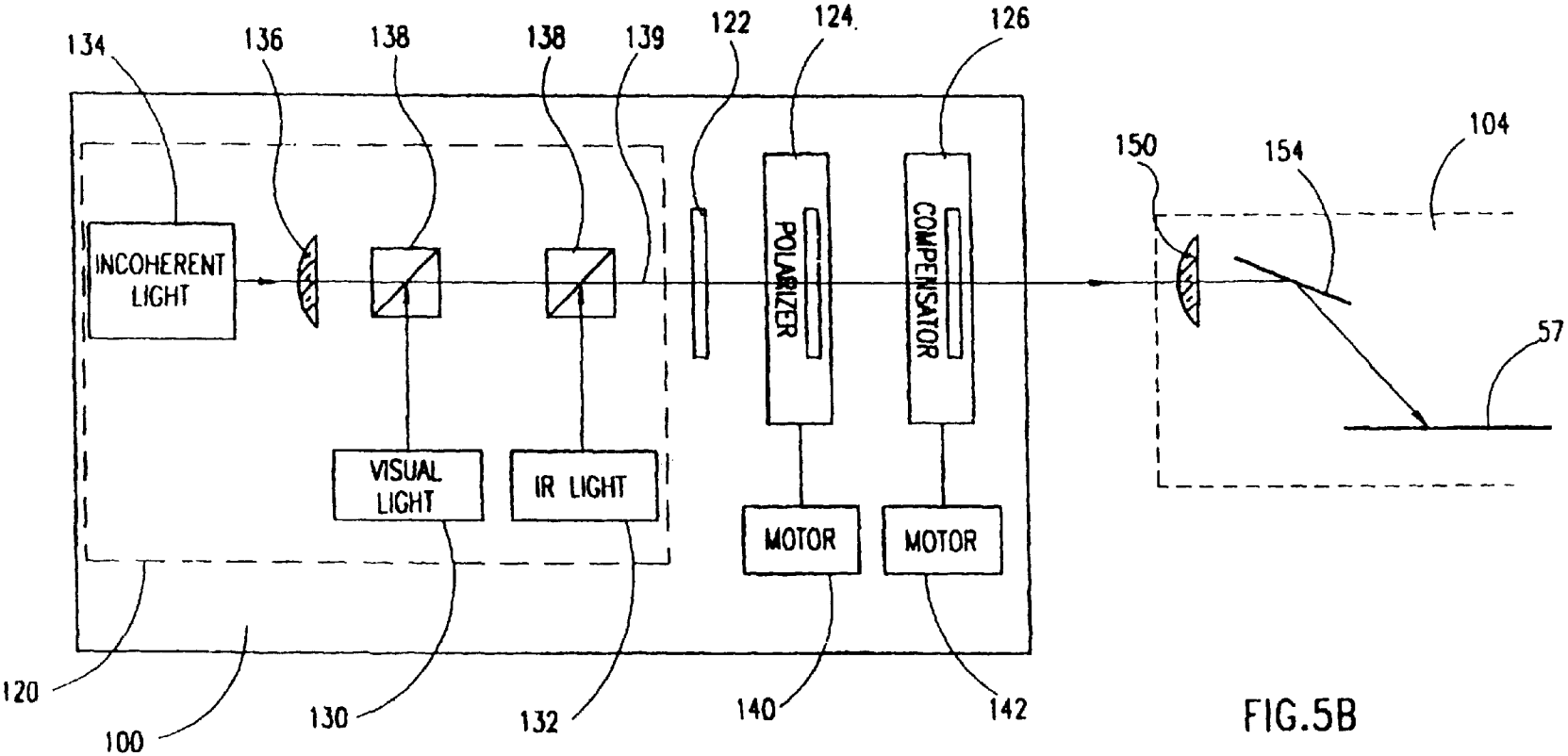
FIG. 5B is a schematic illustration of an illumination unit and part of the beam deflector of FIG. 5A, both forming part of the monitor of FIG. 4.
Figure 5C:
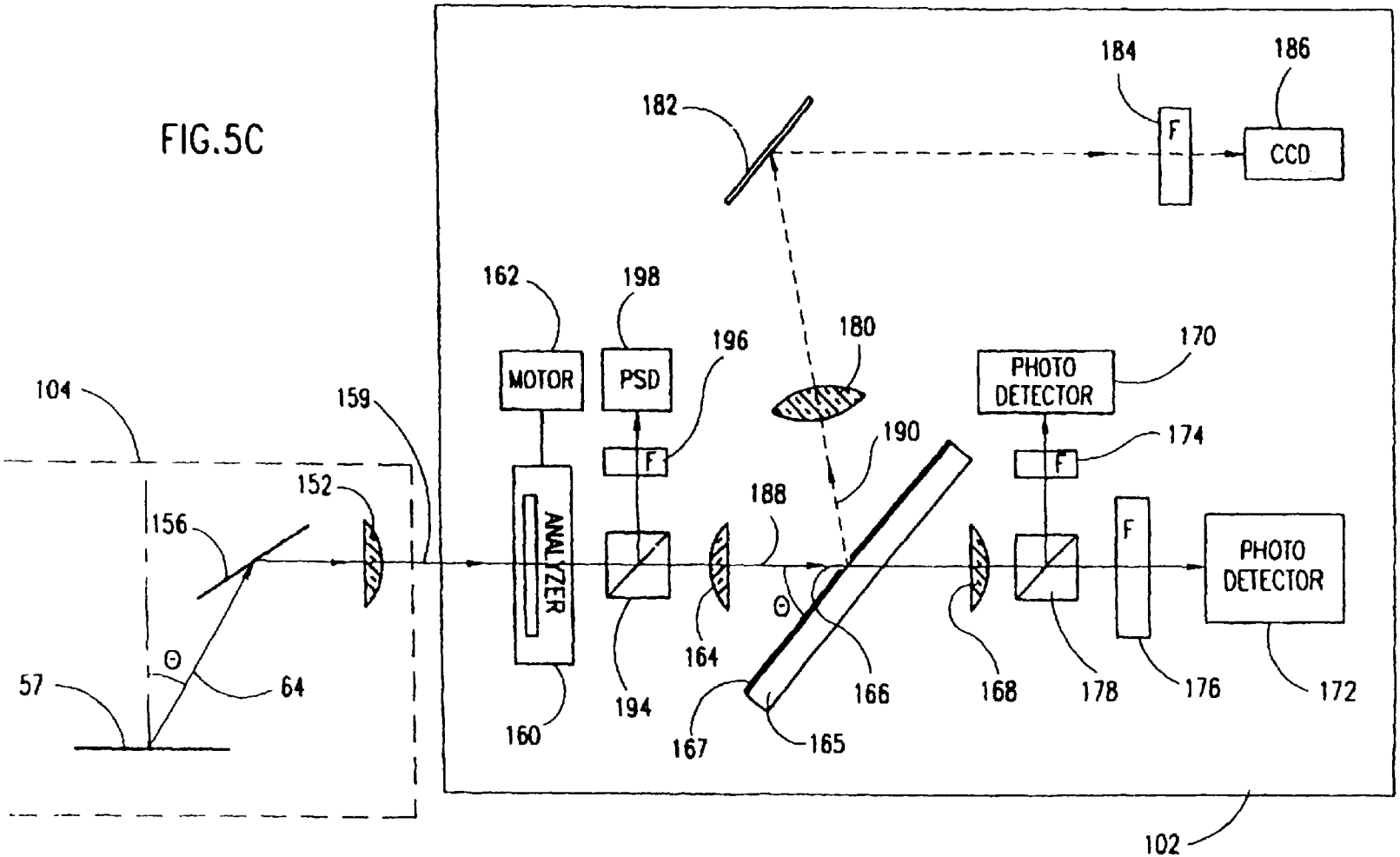
FIG. 5C is a schematic illustration of a detection unit and part of the beam deflector of FIG. 5A, both forming part of the monitor of FIG. 4.

Reference is now made to FIGS. 4 and 5A, 5B and 5C which illustrate an in process thickness monitor. FIG. 4 is a partial schematic, partial block-diagram illustration and FIGS. 5A–5C are schematic illustrations of the elements of the monitor of FIG. 4.

The monitor of FIG. 4 is operative to measure the thickness of the thin films within deposition equipment such as cluster tools. A cluster tool is a large vacuum system which consists of several chambers, each performing a specific deposition process on a single silicon wafer ("single wafer processing"). An internal robot transfers each wafer from chamber to chamber without breaking the vacuum, thus several deposition processes may be carried out before the wafer is removed from the cluster tool.

The present invention is typically installed on a cool-down vacuum chamber to which each wafer is brought for one-two minutes after each deposition process. It thus measures the film thickness after each deposition.

In accordance with the present invention, the in-process monitor comprises a coherent and an incoherent imaging unit and an angle of incidence measuring unit, portions of whose optical paths are identical. The coherent imaging unit is utilized for ellipsometric measurements and thus, is similar to that described hereinabove with respect to FIG. 2. The incoherent imaging unit is typically operative for pattern recognition.

The monitor comprises an illumination unit, labeled 100, a detection unit, labeled 102, a beam deflector, labeled 104, and support 105, similar to support 56.

Since a vacuum must be maintained, all of the elements of the monitor, except the support 105 and the sample 57 on it, must exist outside of the vacuum chamber, labeled 108. This is shown in FIGS. 4 and 5A.

In accordance with the present invention, built into a cover 110 of vacuum chamber 108, along the direction of the X-axis, are two stationary glass plates 112 operative to enable the light beam to reach the sample 57 from outside the chamber. To minimize the influence plates 112 have on optical measurements, the planes of their surface are located perpendicular to the path of optical beams 59 and 64.

The glass plates 112 are mechanically strong enough to withstand the pressure difference between the vacuum within chamber 108 and the atmospheric pressure outside of it. The plates 112 are made from stress free glass of about 5 mm thick and their aspect ratio (width/length) is about 1:50. The resultant induced birefringence is negligible and therefore, the plates generally do not affect the optical measurements.

Beam deflector 104 (see FIG. 5A) typically comprises focusing lens 150 and objective lens 152, two mirrors 154 and 156 and X-axis translation apparatus 153 (see FIG. 4), such as a linear motor.

During ellipsometric measurements, focusing lens 150 focuses the polarized and collimated light beam, labeled 158, onto the surface of sample 57 and the objective lens 152 collimates the divergent beam 64 into the reflected beam, labeled 159. An important fact to note is that lenses 150 and 152 are thin, simple lenses made of stress free glass to reduce to zero their birefringence. They may also be located between the mirrors 154 and 156 and the sample 57.

The two mirrors 154 and 156 are similar to mirrors 72 and 74 of FIG. 2 and are operative to direct the light beam to and from the sample 57 at the desired angle of incidence Θ in the Y-Z plane and to deflect the light beam between the X- and Y-axes, as shown in FIG. 4.

Thus, the light beam 59 always impinges on the sample 57 at the desired angle of incidence Θ, even though the beam deflector 104 is translated along the X-axis.

The illumination unit 100 is detailed in FIG. 5B and typically comprises a light source unit 120, a quarter wave plate (QWP) 122, a polarizer 124 and a compensator 126.

The light source unit 120 typically comprises two coherent light sources 130 and 132 for ellipsometric measurements and one incoherent light source 134 and a condenser 136 for incoherent imaging. The condenser 136 collimates the output of light source 134.

Illumination unit 100 also comprises two beam splitters 138 for combining the light from the three light sources 130, 132 and 134 onto a single path 139. Beam-splitters 138 typically are dichronic or polarizing. If they are polarizing, the planes of polarization of the two lasers 130 and 132 are set to be orthogonal.

The two coherent light sources 130 and 132 are laser diodes which produce highly monochromatic and collimated light for ellipsometric measurements. Laser 130 has a wavelength lambda_1 in the visible spectral range, preferably within the range of 630 to 680 nm, and laser 132 has a wavelength lambda_2 in the near infra-red (IR) spectral range, preferably within the range of 810 to 830 nm. The visible light is preferable for measuring such films as silicon dioxide, silicon nitride and other dielectric layers. The IR light is preferable for silicon layers (poly-silicon, amorphous silicon and the like). Under IR light, the silicon layers are almost transparent and their optical parameters are generally repeatable between processes.

The incoherent light source 134, used during pattern recognition, can be any suitable light source, such as a high brightness LED, quartz-tungsten lamp, xenon arc lamp, etc. Its specific range should preferably be narrow, for example 780±20 nm.

During imaging operations, the incoherent light source 134 is operative and it, together with the focusing lens 150, and the condenser 136 form an incoherent illuminator whose light beam forms an incoherent light spot on the surface of sample 57. The size and divergence of the incoherent light beam must be sufficient to illuminate the desired field of view, e.g. about 1 mm in its shortest dimension, at any position of the beam deflector 104 along the X-axis.

The quarter-wave plate (QWP) 122, useful for ellipsometric measurements, is oriented with its optical axis at an angle of ±45° relative to the planes of polarization of the lasers 130 and 132 and transforms their linear polarization to a circular one. The QWP 122 should be achromatic throughout the utilized spectral range of 630 to 830 nm. Suitable achromatic QWPs are manufactured, for example, by Meadowlarc Optics company, U.S.A.

The polarizer 124 and compensator 126 have associated therewith motor drives 140 and 142, respectively. Although not shown, motor drives 140 and 142 typically operate with precise angular encoders. Since most ellipsometric measurement algorithm do not require rotation of the compensator, a manual driving mechanism (for alignment only) may alternatively be used instead of the motor drive 142.

For the two wavelength configuration of the present invention, the polarizer 124 is achromatic. A suitable polarizer is a Glan-Thomson polarization prism. For a single wavelength configuration in the red spectral range, a sheet polarizer, such as the HN38S type from Polaroid Corporation of the U.S.A., is suitable. For all polarizers, an extinction ratio of more than $10^5$ is required for reaching the thickness measurement accuracy required in microelectronic deposition process control.

The detection unit 102 (FIG. 5C) typically comprises a two-dimensional image acquisition system (part of the incoherent imaging unit), an ellipsometric detector unit (part of the coherent imaging unit) and an angle of incidence measurement unit.

The ellipsometric detector unit of detection unit 102 is comprised of elements similar to those of the ellipsometer of FIG. 2, but extended to operate with the two wavelengths, lambda_1 and lambda_2. The ellipsometric detector unit operates with the objective lens 152 and typically comprises the analyzer, labeled 160, its associated motor 162, an imaging lens 164, a diaphragm 165 having a pinhole 166, a condenser 168, two independent photo-detectors 170 and 172, two band pass spectral filters 174 and 176 and a beam splitter 178. The analyzer 160 is similar to polarizer 124 and is therefore, achromatic for the two wavelength configuration.

Since, as in the embodiment of FIG. 2, the pinhole 166 is located at the image plane of the optical imaging system (lenses 152 and 164) which is the focal plane of lens 164, only that portion of the light reflected from the surface of sample 57 which is the size of pinhole 166 will come through pinhole 166. Condenser 168 collects the light and focusses it onto the photo-detectors 170 and 172.

The beam splitter 178 splits the incoming beam into two beams, each having the appropriate wavelength, lambda_1 and lambda_2.

The photo-detectors 170 and 172 detect, via the filters 174 and 176 respectively, the intensity of light of the two wavelengths lambda_1 and lambda_2, respectively. For most applications, the photo-detectors are silicon photovoltaic detectors, such as the S5591 manufactured by Hamamatsu Photonics U.U. of Hamamatsu City, Japan. If necessary, more sensitive but more expansive photomultipliers may be used.

It is noted that the present invention allows simultaneous measurement of two wavelengths which enables the measurement of two pairs of ellipsometric parameters, the amplitude parameter psi and the phase parameter delta. As a result, four parameters of the thin film structure, e.g. thickness and index of refraction of each of two layers, can be simultaneously determined. Such a measurement is useful when two different layers are deposited on the sample 57 in one deposition cycle.

Since lenses 152 and 164 are designed to be generally free of aberrations in the two wavelengths lambda_1 and lambda_2, the spatial resolution of the monitor of the present invention depends only on the size of pinhole 166 and on the point spread function of the coherent imaging system. The point spread function is defined by the F-stop of the coherent imaging system and is generally quite small. Practically, the thickness measurements are carried out on scribe lines, pads or special test areas which are not less than 50 μm wide and therefore, a pinhole size of 20–40 μm and an F# of 5–6 is acceptable.

It is noted that a circular pinhole produces an elliptical measurement spot, with an aspect ratio of $1/\cos\Theta$. If this is unacceptable, the shape of pinhole 166 has to be asymmetrical to compensate.

The two-dimensional image acquisition system typically operates in conjunction with the incoherent image illuminator and utilizes the objective lens 152 located on the beam deflector 104. The image acquisition system typically comprises the imaging lens 164, the diagram 165 with the pinhole 166, a magnifying lens 180, a mirror 182, an optional band pass filter 184 and a high resolution, area charge coupled device (CCD) 186. For the purposes of the image acquisition system, the diaphragm 165 is made from a grating 167 which has the pinhole 166 therein. The grating 167 does not affect the ellipsometric measurements.

The surfaces of sample 57 and grating 167 are respectively located in the focal planes of lenses 152 and 164. The lenses 152 and 164 typically have the same focal length, thereby providing an optical magnification M of 1×.

As is known in the art, if the object plane is tilted relative to the imaging axis (the axis of the reflected beam 64), the image plane is also tilted relative to the optical axis (the axis of a beam 188) from the analyzer 160. However, the extent of the tilting of the image plane is a function of the magnification, as described by the Scheimpflug equation:

$$\mathrm{tg}\Theta''=M-\mathrm{tg}\Theta, \quad (1)$$

where $\Theta$ is the angle of incidence and $\Theta''$ is the tilt angle of the image plane.

In the monitor of FIG. 5, the grating 167, tilted by the angle $\Theta$ relative to axis 188, is the imaging plane for the imaging system of lenses 152 and 164 and is the object plane (or intermediate image plane) for the imaging system of lens 180.

Since the magnification M of the monitor is 1, the object plane (sample surface) and the image plane are tilted at the same angle $\Theta$ relative to their optical axes. Unfortunately, when the image plane is thus tilted, only a portion of it can be focused on the CCD 186.

In order to force the image plane to be perpendicular to the optical axis, thereby ensuring that the entire image plane is focused on the CCD 186, the grating 167 is aligned along the intermediate image plane. The grating 167 is chosen so that only the first diffraction maximum is utilized for imaging to the CCD 186. For example, for lambda_3=780 nm. $\Theta$=70° and a grating frequency 1200 cycles/mm, the image plane of a diffracted beam 190 is almost perpendicular to the optical axis. Therefore the image plane may be enlarged by the magnifying lens 180 without the above-described Scheimpflug problem.

The magnifying lens 180 is placed in the direction of the first diffraction maximum for the wavelength lambda_3 of the incoherent illuminator. The lens 180 provides magnification, of at least 5×, which is strong enough for recognition of the test areas of the wafer.

Mirror 182 directs the diffracted beam 190 towards the CCD 186 which is located at the image plane of magnifying lens 180. The high resolution CCD 186, such as the TM-6CN CCD manufactured by Pulnix America Inc. of Sunnyvale, Calif., U.S.A. transforms the image to a video signal.

If lasers 130 and 132 operate at the same time as the incoherent light source 134, the optional band pass filter 184 ensures that only light from the incoherent illuminator is used for imaging.

If the incoherent light is not monochromatic, the diffraction of grating 167 will produce spectral dispersion. In this case, the numerical aperture of lens 180 has to be high enough to collect most, if not all, of the diffraction beams within the entire spectral range. In order to achieve high image quality, the lens 180 should be corrected for the chromatic aberrations in the spectral range of the incoherent light.

The quality of the obtained image depends strongly on the F-stops (F#) of the objective and imaging lenses 152 and 164 and the aberrations that they produce. For a focal length for lenses 152 and 164 of about 30 mm and a beam diameter of about 5 mm, the F# is about 6, a value which is used for high quality photography and other applications.

The lens 180 is a high quality microscope grade objective lens and therefore, does not significantly affect the final image quality. The grating 167 also does not significantly affect the image quality because its spatial frequency in the image plane (1200/5×=240 cyc/mm) is significantly greater than the Nyquist frequency of the CCD (about 50 cyc/mm). Therefore the above two-dimensional image acquisition system provides the high spatial resolution needed for accurate pattern recognition.

For the two-dimensional image acquisition system, the pinhole 166 serves to locate the measurement spot in the image of the sample 57. Since the pinhole 166 is located at the intermediate image plane (grating 167) and since it allows light to pass through it, rather than being reflected toward the CCD 186, the pinhole 166 appears as a sharp dark point in the image produced by the CCD 186. Thus, when viewing the CCD image, the location of the measurement spot is immediately known, it being the location of the dark spot.

It is noted that the pinhole 166 performs three functions: 1) it reduces the scattered light from the mirror 154 and 156; 2) it provides high spatial resolution; and 3) it provides an indication of the location of the measurement spot in the image of the area being measured.

The angle of incidence measurement unit provides feedback about the actual angle of incidence $\Theta$ for situations when the surface of the sample 57 is not absolutely flat.

The angle of incidence measurement unit typically comprises the objective lens 152, a beam-splitter 194, a spectral filter 196 and a position-sensitive detector (PSD) 198, such as the S2044 detector manufactured by Hamamatsu Photonics U.U. Beam splitter 194 provides a portion of reflected beam 159 to the PSD 198 via the spectral filter 196.

Since the measurement point on the sample 57 is in the focal plane of objective lens 152 and since the PSD 198 is in the far field of this lens, any change in the angle of reflection (equal to the angle of incidence on the non-flat surface of sample 57) displaces the light spot on the PSD 198 and may be accurately measured. If the light spot is centered on the PSD 198, the angle of incidence is expected angle of incidence Θ, typically of 70°. If the spot is below or above the central location, the actual angle of incidence is larger or smaller, respectively, than Θ. The relationship describing the extent of the skew with the change in the actual angle of incidence is calibrated prior to operating the monitor. The ellipsometric measurements are then interpreted, by a data processor (not shown), in light of the actual angle of incidence.

It is noted that most supports typically comprise means (not shown) for keeping the top surface of sample 57 in a fixed position, such as by vacuum or electrostatic clamping, an auto-focus mechanism. Once such systems have been actuated, the only reason for beam displacement on the PSD 198 is the deviation in the angle of incidence.

Reference is now made to FIG. 6 which illustrates a spectrophotometer designed in accordance with the principles of the present invention. Thus, the spectrophotometer comprises a light source 200, a beam deflector 202, a support 204 holding a sample 208, a detector unit 206.

The beam deflector 202 typically comprises an objective lens 210, a beam splitter 212 and a mirror 214. From the light source 200, the beam splitter receives a light beam 209, parallel to the surface of the sample 208, and deflects it toward the sample 208, via lens 210. The sample 208 is located in the focal plane of lens 210. The reflected light beam (not labeled) is collimated by lens 210, passes through beam splitter 212 and is deflected by mirror 214 along an axis parallel to the surface of sample 208.

Since light beams 209 and 211 are parallel to each other and to the surface of sample 208, the movement of the beam deflector 202 in the X direction does not affect the measurements of the detector unit 206.

As in the embodiments of FIGS. 2 and 3, detector unit 206 typically comprises an imaging lens 218, a diaphragm 220 having a pinhole 222 and a condenser 224. Detector unit 206 additionally comprises a spectrophotometric detector 226. Elements 218–224 reduce the scatter due to mirror 214 and provide a useful beam to the spectrophotometric detector 226.

Figure 7:
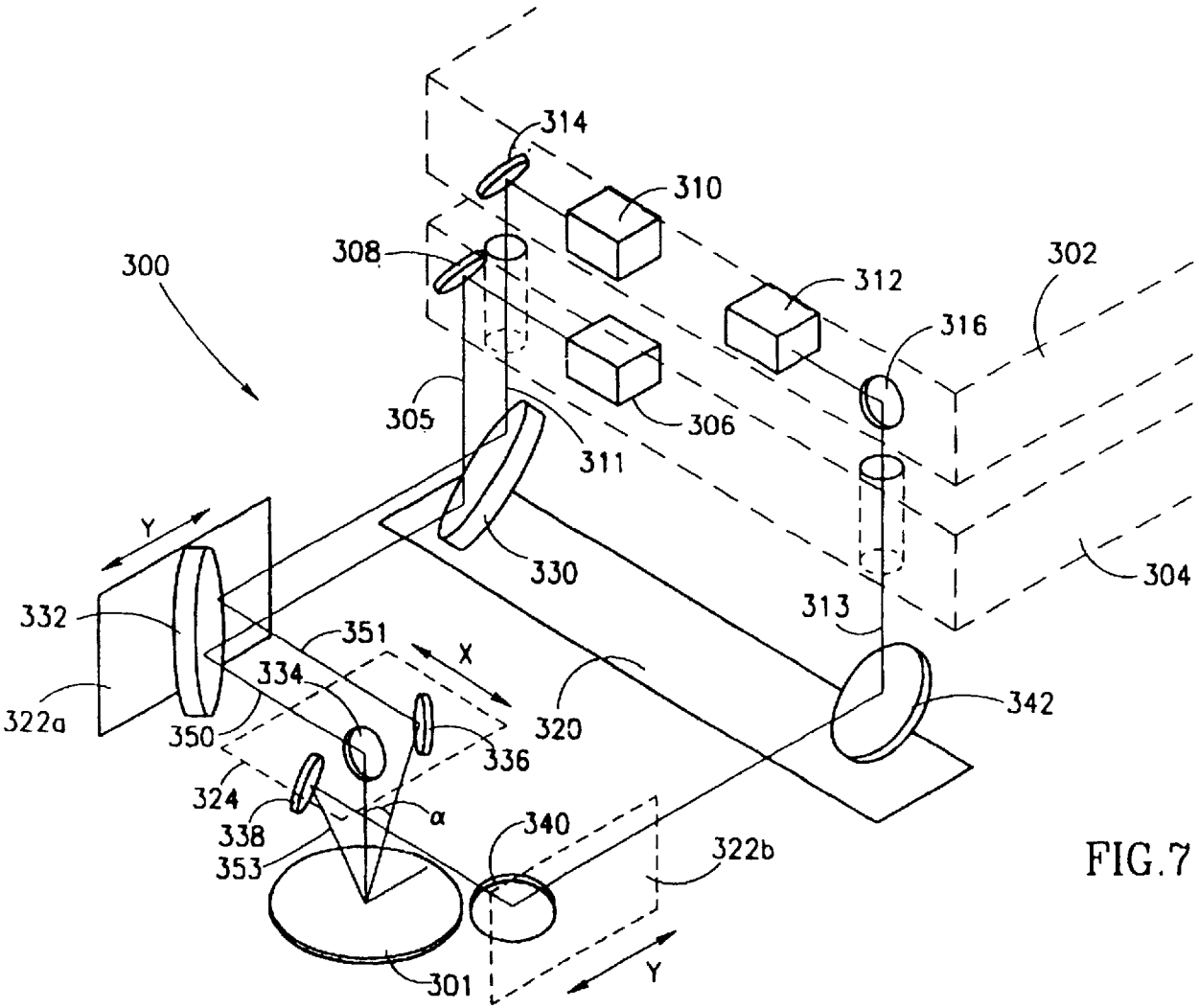
FIG. 7 is a schematic illustration of a further embodiment of the beam deflector of the present invention which deflects beams from two different optical assemblies.

Reference is now made to FIG. 7 which illustrates a further embodiment of the present invention. In this embodiment, the beam deflector, labeled 300, deflects beams for multiple optical assemblies towards a wafer 301. FIG. 7 illustrates two optical assemblies, an ellipsometric assembly 302 and a spectrophotometric assembly 304, one above the other. It will be appreciated that the order of the two assemblies is not of interest.

The spectrophotometric assembly 304 comprises, shown by a box labeled 306, the entirety of optical and controlling elements needed for spectrophotometry, except those elements which deflect the light beam towards the wafer 301. The details of the elements of box 306 have been provided hereinabove with respect to FIG. 6 and therefore, will not be described in detail herein. Spectrophotometric assembly 304 also comprises a mirror 306 for deflecting a light beam, labeled 305, from assembly 304 to the beam deflector 300 and vice versa.

The ellipsometric assembly 302 comprises an illuminator 310 and an analyzer 312, similar in function to the illuminator 100 and analyzer 102 of FIG. 4, and two mirrors 314 and 316 for respectively deflecting an input light beam 311 from illuminator 310 to the beam deflector 300 and an output light beam 313 from the beam deflector 300 to the analyzer 312.

Below both assemblies 302 and 304 is a fixed input/output surface 320 on which are mounted an input mirror 330 and an output mirror 342. The input and output mirrors 330 and 342, respectively, deflect light beams into and out from the optical assemblies 302 and 304.

Mechanically, the beam deflector 300 is similar to the beam deflector of FIG. 3 and comprises a translatable Y-axis stage 322 (shown in two sections 322a and 322b) and a translatable X-axis stage 324 which translates along the Y-axis stage 322.

Optically, the beam deflector 300 comprises a Y-to-X mirror 332, a spectrophotometry mirror 334, an input ellipsometry mirror 336, an output ellipsometry mirror 338 and an X-to-Y mirror 340. The Y-to-X mirror 332 and X-to-Y mirror 334 are mounted on the separate sections of the Y-axis stage 322, where the Y-to-X mirror 332 deflects input light beams from the Y to the X axis and the X-to-Y mirror 334 deflects output light beams from the X to the Y axis. The remaining elements are mounted on the X-axis stage and perform the actual optical measurement.

For the spectrophotometric measurements, light beam 305 is deflected by input mirror 330 in the Y direction along a first Y axis (not illustrated for clarity) towards the Y-to-X mirror 332 which, in turn, deflects the light beam, now labeled 350, towards the spectrophotometric mirror 334. Mirror 334 deflects the light beam 350 towards the wafer 301 at an angle perpendicular to the wafer 301. The reflected light returns to mirror 334 and is reflected back through mirrors 332 and 330 to the spectrophotometric assembly 304.

For the ellipsometric measurements, light beam 311 also is reflected by mirrors 330 and 332 towards the X-axis stage 324. However, as shown in FIG. 7, light beam 311 is reflected along second set of X and Y-axis (also not illustrated) close but parallel to the first set of axes along which the light beam 305 is reflected. Thus, the two light beams are deflected along parallel paths until reaching the X-axis stage 324.

The input ellipsometry mirror 336 is positioned on the X-axis stage at the appropriate height above the wafer so as to receive "ellipsometric" light beam, labeled 351, from the Y-to-X mirror 332. Mirror 336 deflects beam 351 towards the wafer 301 so as to impinge upon wafer 301 at the appropriate angle α. The angle α, as shown in FIG. 7, is the angle from the normal to the wafer 301. The actual angle of incidence at the time of performing the measurements must be measured for proper ellipsometric measurements. The method described hereinabove with respect to FIG. 5C can be utilized.

The reflected beam, labeled 353, impinges upon mirror 338 and is deflected thereby towards X-to-Y mirror 340. From the mirror 340, the output beam travels along the Y direction and is deflected by mirror 342 into the ellipsometric assembly 302. Mirror 316, in turn, directs the output beam into the analyzer 312 for processing.

It will be appreciated that the beam deflector 300 provides translation for the measuring optics of a multiplicity of optical measuring units as a single unit. The type of measuring unit does not matter; rather, the optical paths at the point of measurement should not cross. In the embodiment of FIG. 7, the spectrophotometric measuring optics view the wafer perpendicularly to the wafer while the ellipsometric measuring optics view the wafer at an angle. The deflecting mirrors of the two measuring units can thus be combined together into a single, translatable unit.

It will be appreciated by persons skilled in the art that the present invention is not limited to what has been particularly shown and described hereinabove. Rather the scope of the present invention is defined by the claims which follow:

I claim:

[1. A two-dimensional beam deflector for a thickness measuring device for measuring the thickness of films on a sample with a plurality of different optical systems each performing a different measurement technique, the beam deflector comprising:

two-dimensional translation means for translating said beam deflector along a first scanning axis and along a second scanning axis perpendicular to said first scanning axis;

first deflection means for receiving a plurality of parallel input beams along parallel input axes, said input axes being close to each other and parallel to said first scanning axis, and for deflecting said input beams along a plurality of parallel second axes, said second axes being close to each other and parallel to said second scanning axis;

second deflection means for receiving a plurality of parallel output beams along parallel third axes, said third axes being close to each other and parallel to said second axes, and for deflecting said output beams along a plurality of parallel fourth axes, said fourth axes being close to each other and parallel to said first scanning axis; and a plurality of optical assemblies, one per input beam, wherein each optical assembly provides its input beam towards said sample, receives its output beam from said sample, processes its input and output beams in accordance with its measurement technique, and provides its output beams along said parallel third axes.]

[2. A beam deflector according to claim 1 and wherein said optical assemblies comprises at least an ellipsometric assembly and a spectrophotometric assembly.]

[3. A thickness measuring device for measuring the thickness of thin films on a sample with two measurement devices, the device comprising:

first and second stationary illuminators, one for each of said two measurement devices, for providing first and second collimated input light beams along first and second parallel input axes;

a beam deflector for directing said first and second input light beam toward said sample and for directing and collimating corresponding first and second output light beams for said sample, said beam deflector including two-dimensional translation means for translating said beam deflector along a first scanning axis parallel to said input axis, and along a second scanning axis perpendicular to said first scanning axis; and first and second stationary receivers, one for each of said two measurement devices, for respectively receiving said first and second output light beams along output axes parallel to said input axes.]

[4. An ellipsometer for measuring the thickness of thin films on a sample comprising:

a stationary illuminator for providing a collimated input light beam along an input axis;

a beam deflector translatable at least along a first scanning axis parallel to said input axis including:

a first beam deflecting element for deflecting said input light beam at a first angle of deflection towards said sample;

a second beam deflecting element, different from said first beam deflecting element, for deflecting an output light beam reflected at a second angle from said sample along an output axis; and a collimating lens for receiving at least said output light beam from said second beam deflecting element and for collimating at least said output light beam; and a stationary receiver for receiving said collimated output light beam along an output axis parallel to said input axis.]

[5. A device according to claim 4 and wherein said beam deflector comprises two-dimensional translation means for translating said beam deflector along said first scanning axis and along a second scanning axis perpendicular to said first scanning axis.]

[6. A device according to claim 5 where said beam deflector additionally comprises a first mirror for deflecting said input light beam from said input axis to said second scanning axis, a second mirror for deflecting said input light beam from said second scanning axis to said sample, a third mirror for deflecting a reflected light beam reflected from said sample to said second scanning axis, and a fourth mirror for deflecting said reflected light beam from said second scanning axis to said output axis.]

[7. An ellipsometer for measuring the thickness of thin films on a sample comprising:

a stationary illuminator for providing a collimated input light beam along an input axis;

a beam deflector translatable at least along a first scanning axis parallel to said input axis including:

a first beam deflecting element for deflecting said input light beam at a first angle of deflection towards said sample;

a second beam deflecting element, different from said first beam deflecting element, for deflecting an output light beam reflected at a second angle from said sample along an output axis; and a collimating lens for receiving at least said output light beam from said second beam deflecting element and for collimating at least said output light beam; and a stationary receiver for receiving said collimated output light beam along an output axis parallel to said input axis, wherein said beam deflector comprises one-dimensional translation means for translation along said scanning axis.]

[8. An ellipsometer for measuring the thickness of thin films on a sample comprising:

a stationary illuminator for providing a collimated input light beam along an input axis;

a beam deflector translatable at least along a first scanning axis parallel to said input axis including:

a first beam deflecting element for deflecting said input light beam at a first angle of deflection towards said sample;

a second beam deflecting element, different from said first beam deflecting element, for deflecting an output light beam reflected at a second angle from said sample along an output axis; and a collimating lens for receiving at least said output light beam from said second beam deflecting element and for collimating at least said output light beam; and a stationary receiver for receiving said collimated output light beam along an output axis parallel to said input axis, wherein said first and second beam deflecting elements are mirrors.]

[9. An ellipsometer for measuring the thickness of thin films on a sample comprising:

a stationary illuminator for providing a collimated input light beam along an input axis;

a beam deflector translatable at least along a first scanning axis parallel to said input axis including:

a first beam deflecting element for deflecting said input light beam at a first angle of deflection towards said sample;

a second beam deflecting element, different from said first beam deflecting element, for deflecting an output light beam reflected at a second angle from said sample along an output axis; and a collimating lens for receiving at least said output light beam from said second beam deflecting element and for collimating at least said output light beam; and a stationary receiver for receiving said collimated output light beam along an output axis parallel to said input axis, wherein said first beam deflecting element is a beam splitter and said second beam deflecting element is a mirror.]

[10. An ellipsometer for measuring the thickness of thin films on a sample comprising:

a stationary illuminator for providing a collimated input light beam along an input axis;

a beam deflector translatable at least along a first scanning axis parallel to said input axis including:

a first beam deflecting element for deflecting said input light beam at a first angle of deflection towards said sample;

a second beam deflecting element, different from said first beam deflecting element, for deflecting an output light beam reflected at a second angle from said sample along an output axis; and a collimating lens for receiving at least said output light beam from said second beam deflecting element and for collimating at least said output light beam; and a stationary receiver for receiving said collimated output light beam along an output axis parallel to said input axis, and also including means for measuring an actual angle of incidence which may vary from said second angle of deflection, wherein said means for measuring utilizes optical elements forming part of said stationary illuminator and stationary receiver.]

[11. A device according to claim 10 and wherein said means for measuring comprises a position sensing device for measuring the angle of said output light beam with respect to a desired position.]

*12. A processing apparatus for processing a semiconductor sample, the apparatus comprising:*

*(i) a processing unit comprising several chambers for processing of a top layer of the sample under certain vacuum conditions within a working area inside the processing unit;*

*(ii) an optical monitoring station associated with said processing unit and defining a monitoring area in one of the chambers outside said working area, said one of the chambers having an optical window through which at least a portion of said top layer of the sample is observable from outside of the chamber; and*

*(iii) a robot for transferring said sample from said working area to said monitoring area without breaking the vacuum conditions,*

*wherein said optical monitoring station comprises an optical monitoring unit, accommodated outside said at least one of the chambers and operable for monitoring at least one desired parameter of at least said top layer of the sample through said optical window, while the sample is located inside said chamber under certain vacuum conditions.*

*13. A processing apparatus according to claim 12, wherein the vacuum-based processing unit comprises deposition equipment.*

*14. A processing apparatus according to claim 12, wherein said vacuum chamber is a part of the processing unit.*

*15. A processing apparatus according to claim 14, wherein said chamber is cool down chamber.*

*16. A processing apparatus according to claim 12, wherein said at least one desired parameter is thickness of said at least top layer of the sample.*

*17. A processing apparatus according to claim 12, wherein said at least one desired parameter is refraction index of said at least top layer of the sample.*

*18. A processing apparatus according to claim 12, wherein said optical monitoring unit is operable to scan at least a portion of the sample through said optical window.*

*19. A processing apparatus according to claim 12, wherein said optical monitoring unit comprises a spectrophotometer.*

*20. A processing apparatus according to claim 12, wherein said optical monitoring unit comprises an ellipsometer.*

*21. A processing apparatus according to claim 12, wherein said optical monitoring unit comprises an imaging unit operable for performing pattern recognition technique such as to determine a measurement site location.*

*22. A processing apparatus according to claim 12, wherein said optical monitoring unit comprises a movable beam deflector.*

*23. A processing apparatus according to claim 19 wherein said optical monitoring unit comprises a movable beam deflector and is operable to scan at least a portion of the sample through said optical window.*

*24. A processing apparatus according to claim 23, wherein said optical monitoring unit comprises an objective lens arrangement.*

*25. A processing apparatus according to claim 19 wherein said optical monitoring unit comprises an imaging unit operable for performing pattern recognition technique such as to determine a measurement site location.*

*26. A processing apparatus according to claim 20, wherein said one of the chambers has an additional optical window.*

*27. A processing apparatus according to claim 12, wherein said optical monitoring unit comprises a stationary mounted illuminator.*

*28. A processing apparatus according to claim 19, wherein said optical monitoring unit comprises a stationary mounted illuminator.*

*29. A processing apparatus according to claim 20, wherein said optical monitoring unit comprises a stationary mounted illuminator.*

*30. A processing apparatus according to claim 19, wherein said spectrophotometer is stationary mounted.*

*31. A processing apparatus according to claim 12, wherein said vacuum-based processing unit is a cluster tool.*

*32. A processing apparatus according to claim 12, wherein said semiconductor sample is wafer.*

*33. A processing apparatus according to claim 12, wherein said optical monitoring unit is operable to scan at least the portion of the top layer of the sample observable through said optical window, and comprises a beam deflector for directing light towards the sample and directing light from the sample, and a translation means for translating said beam deflector along at least one scanning axis.*

*34. A cluster tool comprising several chambers for processing a top layer of a semiconductor sample under certain vacuum conditions within a working area of the tool, the cluster tool comprising:*

*an optical monitoring station, that defines a monitoring area in one of the chambers outside said working area, said one of the chambers being formed with an optical window through which at least a portion of the top layer of the sample is observable from outside of the chamber, and comprises an optical monitoring unit located outside said one of the chambers and operable for monitoring at least one desired parameter of the sample through said optical window, while the sample is located inside said one of the chambers under certain vacuum conditions; and*

*a robot for transferring the sample from said working area to said monitoring area without breaking the vacuum conditions.*

*35. A method for processing a semiconductor sample utilizing a vacuum-based processing unit having several chambers, and an optical monitoring station, the method comprising:*

*(a) processing a top layer of the sample under certain vacuum conditions within a working area inside the processing unit;*

*(b) transferring the sample from the working area to a monitoring area located inside one of the chambers and outside the working area, wherein said one of the chambers is formed with an optical window through which at least a portion of the top layers of the sample is observable from outside of the chamber, said transferring being carried out by a robot without breaking the vacuum conditions; and*

*(c) applying optical monitoring to at least a portion of said sample from the outside of the chamber through said optical window for monitoring at least one desired parameter of the sample, while the sample is located in the monitoring area inside the chamber under certain vacuum conditions.*

*36. A method according to claim 35, wherein said processing of the sample utilizes a deposition technique.*

*37. A method according to claim 35, wherein the sample is conveyed to said monitoring area from the working area after being processed.*

*38. A method according to claim 35, wherein said optical monitoring comprises thickness measurements of at least the top layer of the sample.*

*39. A method according to claim 35, wherein said optical monitoring comprises measurements of refraction index of at least the top layer of the sample.*

*40. A method according to claim 35, wherein said optical monitoring comprises scanning at least a portion of the sample through said optical window.*

*41. A method according to claim 35, wherein said optical monitoring comprises spectrophotometric measurements.*

*42. A method according to claim 35, wherein said optical monitoring comprises ellipsometric measurements.*

*43. A method according to claim 35, wherein said optical monitoring comprises pattern recognition for determining a measurement site location.*

*44. A method according to claim 41, wherein said optical monitoring comprises pattern recognition for determining a measurement site location.*

*45. A method according to claim 42, wherein said optical monitoring comprises pattern recognition for determining a measurement site location.*

*46. A method according to claim 41, wherein said optical monitoring comprises scanning at least a portion of the sample through said optical window.*

*47. A method according to claim 42, wherein said optical monitoring comprises scanning at least a portion of the sample through said optical window.*

*48. A method according to claim 35, wherein said semiconductor sample is a wafer.*

*49. A method according to claim 41, wherein said semiconductor sample is a wafer.*

*50. A method according to claim 42, wherein said semiconductor sample is a wafer.*

* * * * *